US011885829B2

United States Patent
Sylvester et al.

(10) Patent No.: US 11,885,829 B2
(45) Date of Patent: Jan. 30, 2024

(54) MATURATION PROCESSES FOR ELECTRIC BATTERIES CELLS

(71) Applicant: DUKOSI LIMITED, Edinburgh (GB)

(72) Inventors: Joel Sylvester, Penicuik (GB); Timothy Crymble, Penicuik (GB); Grant Stone, Thurso (GB); Gregory Cameron, Thurso (GB); Josh Robert Leworthy, Edinburgh (GB)

(73) Assignee: DUKOSI LIMITED, Edinburgh (GB)

( * ) Notice: Subject to any disclaimer, the term of this patent is extended or adjusted under 35 U.S.C. 154(b) by 510 days.

(21) Appl. No.: 16/639,518

(22) PCT Filed: Aug. 14, 2018

(86) PCT No.: PCT/GB2018/052312
§ 371 (c)(1),
(2) Date: Feb. 14, 2020

(87) PCT Pub. No.: WO2019/034869
PCT Pub. Date: Feb. 21, 2019

(65) Prior Publication Data
US 2020/0225290 A1    Jul. 16, 2020

(30) Foreign Application Priority Data

Aug. 14, 2017    (GB) ...................... 1713033

(51) Int. Cl.
*H01M 10/44*    (2006.01)
*G01R 31/388*    (2019.01)
(Continued)

(52) U.S. Cl.
CPC ......... *G01R 31/388* (2019.01); *G01R 31/374* (2019.01); *G01R 31/3865* (2019.01);
(Continued)

(58) Field of Classification Search
CPC ........... H01M 10/0525; H01M 10/052; H01M 10/4228; H01M 10/4207; H01M 10/446;
(Continued)

(56) References Cited

U.S. PATENT DOCUMENTS 6,274,265 B1 *  8/2001  Kraska .............. H01M 10/4285
                                                            429/90
8,116,998 B2    2/2012  Hess
(Continued)

FOREIGN PATENT DOCUMENTS

CN          1099192 A       2/1995
CN        103430372 A      12/2013
(Continued)

OTHER PUBLICATIONS

PCT International Search Report and Written Opinion issued by the International Searching Authority in related PCT Application No. PCT/GB2018/052312, dated Dec. 4, 2018 (13 pgs.).
(Continued)

Primary Examiner — Raymond Alejandro
(74) Attorney, Agent, or Firm — FINNEGAN, HENDERSON, FARABOW, GARRETT & DUNNER LLP

(57) ABSTRACT

A maturation process for an electric battery cell comprises charging the electric battery cell, subjecting the electric battery cell to a maturation period of at least one day while no electrical load other than a measurement apparatus is connected to the electric battery cell, and taking at least one measurement of the open circuit voltage of the electric battery cell during the maturation period using the measurement apparatus. The measurement apparatus is incorporated into a structure of the electric battery cell, forming an integral part of the electric battery cell. The maturation process further comprises determining whether electric bat-
(Continued)

tery cell is defective in dependence on the at least one measurement.

20 Claims, 5 Drawing Sheets

(51) Int. Cl.
G01R 31/396 (2019.01)
G01R 31/385 (2019.01)
G01R 31/374 (2019.01)
H01M 10/0525 (2010.01)
H01M 10/42 (2006.01)
H01M 10/48 (2006.01)

(52) U.S. Cl.
CPC ...... *G01R 31/396* (2019.01); *H01M 10/0525* (2013.01); *H01M 10/4228* (2013.01); *H01M 10/446* (2013.01); *H01M 10/482* (2013.01); *H01M 10/486* (2013.01)

(58) Field of Classification Search
CPC .... H01M 10/448; H01M 10/44; H01M 10/48; H01M 10/482; H01M 10/486; G01R 31/388; G01R 31/396; G01R 31/3865; G01R 31/374
See application file for complete search history.

(56) References Cited

U.S. PATENT DOCUMENTS

| 2012/0053871 | A1 | 3/2012 | Sirard |
| 2014/0049227 | A1 | 2/2014 | Martin et al. |
| 2017/0276732 | A1* | 9/2017 | Yang .................. H01M 10/441 |
| 2018/1643693 | | 6/2018 | Brorein et al. |

FOREIGN PATENT DOCUMENTS

| CN | 104438138 A | 3/2015 |
| JP | H 1027631 A | 1/1998 |
| JP | H 10281881 A | 10/1998 |
| JP | 2001307744 A | 11/2001 |
| JP | 2006253027 A | 9/2006 |
| JP | 2007026844 A | 2/2007 |
| JP | 2010508507 A | 3/2010 |
| JP | 4588614 B2 | 12/2010 |
| JP | 2013084508 A | 5/2013 |
| JP | 2013114986 A | 6/2013 |
| JP | 2014006205 A | 1/2014 |
| JP | 2014025858 A | 2/2014 |
| JP | 2014032918 A | 2/2014 |
| JP | 2014509040 A | 4/2014 |
| JP | 2015072148 A | 4/2015 |
| JP | 2016075567 A | 5/2016 |
| KR | 10-2015-0145558 | 12/2015 |
| WO | WO 2016/021614 A1 | 2/2016 |
| WO | WO 2016/091109 A1 | 6/2016 |
| WO | WO 2019/034869 A1 | 2/2019 |

OTHER PUBLICATIONS

Office Action issued by the Canadian Patent Office in related CA Application No. 3,073,132, dated Nov. 26, 2021 (4 pgs.).
Office Action issued by The State Intellectual Property office of People's Republic of China in related CN Application No. 201880067032.X, dated Feb. 16, 2022 (19 pgs.).
Search Report issued by The State Intellectual Property office of People's Republic of China in related CN Application No. 201880067032.X (2 pgs.).
Notice of Reasons for Refusal issued by the Japanese Patent Office in related JP Application No. 2020-530734, dated Jul. 28, 2021 (17 pgs.).
Decision of Refusal issued by the Japanese Patent Office in related JP Application No. 2020-530734, dated May 31, 2022 (4 pgs.).
Written Opinion issued by the Japanese Patent Office in related JP Application No. 2020-530734, dated Feb. 3, 2022 (8 pgs.).
Notice of Submission of Opinion issued by the Korean Patent Office in related KR Application No. 2020-7007308, dated Feb. 23, 2022 (23 pgs.).
Search Report issued by the Japanese Patent Office in related Japanese Patent Application No. 2020-530734, dated Jun. 8, 2021 (58 pgs.).
Notice of Reasons for Refusal issued by the Japanese Patent Office in related Japanese Patent Application No. 2020-530734, dated Aug. 3, 2021 (27 pgs.).
Communication pursuant to Article 94(3) EPC, issued in related Application No. 18 765 978.4, dated Aug. 4, 2021 (7 pgs.).
First Office Action issued by the Indian Patent Office in related Application No. 202017010857, dated May 28, 2021 (5 pgs.).
Keysight BT2153A Self-Discharge Analyzer—A New Way of Looking at Li-Ion Cell Self-Discharge in Manufacturing Data Sheet by Keysight Technologies, Jul. 18, 2017 (14 pgs.).
First Office Action issued by the Mexican Institute of the Industrial Property (IMPI) in related MX Application No. MX/a/2020/001826, dated May 18, 2023 (9 pgs.).
Request for the Submission of an Opinion issued by the Korean Patent Office in related Korean Application No. 10-2020-7007308, dated Dec. 21, 2022.
Notification of Reason for Refusal issued by the Korean Patent Office issued by the Korean Patent Office in related Korean Application No. 10-2020-7007308, dated Feb. 23, 2022.

* cited by examiner

MATURATION PROCESSES FOR ELECTRIC BATTERIES CELLS

CROSS-REFERENCE TO RELATED APPLICATIONS

This application is a U.S. National Stage filing under 35 U.S.C. § 371 of International Application No. PCT/GB2018/052312, filed Aug. 14, 2018, which claims the benefit of priority of GB application No. 1713033.7, filed on Aug. 14, 2017. The entire contents of the above-referenced applications are expressly incorporated herein by reference.

FIELD OF THE INVENTION

The present invention relates to a maturation process for at least one electric battery cell and in particular but not exclusively to a maturation process for an electric battery comprising at least one electric battery cell.

BACKGROUND ART

Following manufacture, electric batteries, such as a lithium-ion batteries, are subject to a formation charging process. Formation charging constitutes the first charging cycle for a newly manufactured electric battery and involves subjecting the electric battery to carefully controlled charge and discharge cycles to prepare the electric battery for service. Thereafter, and before service, electric batteries are often subject to a maturation process. Maturation is sometimes known as ageing. An object of the maturation process is to identify weak or defective batteries before the electric batteries are brought into service.

A maturation process involves measuring the open circuit voltage of each electric battery, storing the electric batteries for a maturation period of up to several weeks and measuring the open circuit voltage of each electric battery after the maturation period. If the decrease in open circuit voltage from the measurement taken before the maturation period to the measurement taken after the maturation period is greater than a predetermined voltage, the electric battery is rejected as being unfit for service. The maturation process is intended to detect defects of the like of unduly high self-discharge rate, electrolyte seal leaks, mechanical defects, unduly high internal resistance and malformed Solid Electrolyte Interphase (SEI) layer. Such defects usually take time to become evident hence the typically extended length of the maturation period. Maturation is typically performed on higher value electric batteries and may be performed on electric batteries per se, groups of battery cells or individual battery cells.

The present inventors have recognised known maturation processes to have shortcomings. The present invention has been devised in the light of the inventors' appreciation of such shortcomings. It is therefore an object for the present invention to provide an improved maturation process for at least one electric battery cell.

Statement of Invention

According to a first aspect of the present invention there is provided a maturation process for at least one electric battery cell, the process comprising:
  charging the at least one electric battery cell;
  subjecting the at least one electric battery cell to a maturation period of at least one day wherein no electrical load other than a measurement apparatus is connected to the at least one electric battery cell;
  taking at least one measurement of the open circuit voltage of the at least one electric battery cell with the measurement apparatus between the start and the end of the maturation period; and
  determining the integrity of the at least one electric battery cell in dependence on the at least one measurement.

The maturation process comprises charging the at least one electric battery cell. The at least one electric battery cell may be charged to a predetermined charge level, such as 30% of full capacity. The at least one electric battery cell may be charged at the end of a formation process in readiness for maturation. Alternatively, the at least one electric battery cell may be charged in readiness for maturation as a step apart from steps involved in a formation process. The maturation process further comprises subjecting the at least one electric battery cell to a maturation period of at least one day wherein no electrical load other than a measurement apparatus is connected to the at least one electric battery cell. The at least one electric battery cell may, for example, be stored in a storage area during the maturation period. The maturation process further comprises taking at least one measurement of the open circuit voltage of the at least one electric battery cell with the measurement apparatus between the start and the end of the maturation period. More specifically, the at least one measurement of the open circuit voltage may be taken after the start of the maturation period and before the end of the maturation period. The maturation process yet further comprises determining the integrity of the at least one electric battery cell in dependence on the at least one measurement.

Known maturation processes introduce a significant delay between the end of the formation process and onward shipment before electric batteries are brought into service. Furthermore, known maturation processes require significant storage space for electric batteries undergoing maturation. Delay before onward shipment and storage space requirements have a significant upward impact on cost. The present inventors appreciated that electric batteries of compromised integrity often become evident as such before the end of the maturation period. The present invention therefore involves taking at least one measurement of open circuit voltage between the start and the end of the maturation period whereby a defective electric battery cell may be identified before the end of the maturation period.

The at least one measurement may be compared with a predetermined voltage value with the step of determining the integrity of the at least one electric battery cell being in dependence on the comparison. A determination of compromised integrity may be made if the at least one measurement is less than the predetermined voltage value. Unduly high internal self-discharge may be thus identified.

The maturation process may comprise taking plural measurements between the start and the end of the maturation period, the plural measurements being taken at spaced apart times. The maturation process may further comprise comparing a voltage difference between a first and a second of the plural measurements of the open circuit voltage with a predetermined difference value, with the step of determining the integrity of the at least one electric battery cell being in dependence on the comparison. A determination of compromised integrity may be made if the voltage difference is greater than the predetermined difference value. A time difference between the first and second measurements may be determined. The maturation process may determine a rate of change of voltage in dependence on the voltage difference and the time difference. Alternatively or in addition, at least first and second measurements may be compared with stored at least first and second reference measurements. A discharge rate may be determined by way of the comparison with stored reference measurements. Unduly high internal self-discharge may be thus identified.

Furthermore, where there are at least three measurements taken, voltage differences between adjacent pairs of measurements may be determined to thereby obtain at least a first voltage difference and a second voltage difference. The maturation process may comprise determining at least one discharge phase in dependence on voltage differences. For example, a first voltage difference may be indicative of a relaxation phase and a second voltage difference may be indicative of a steady state phase. A discharge curve for an electric battery cells may be provided by taking sufficient open circuit measurements during the maturation period. For example, the discharge curve may be sufficiently characterised by taking measurements at hourly intervals during the maturation period. The step of determining the integrity of the at least one electric battery cell may be in dependence on the determination of at least one discharge phase. More specifically, the step of determining the integrity of the at least one electric battery cell may be in dependence on at least one voltage measurement taken after a relaxation phase.

A first measurement may be taken near the start of the maturation period. In contrast, and according to known maturation processes, the first measurement is taken before the maturation period and typically at the end of the formation period. Electric battery cells undergo a relaxation period immediately following charging whereby an open circuit voltage measurement taken immediately following charging, such as at the end of a formation process, may provide a misleadingly high first measurement. A trajectory of open circuit voltage measurements over time may be compared with a predetermined trajectory to determine the end of the relaxation period. The step of determining the integrity of the at least one electric battery cell may be in dependence on open circuit voltage measurements taken after the end of the relaxation period.

The maturation process may further comprise taking at least one resistance measuring voltage measurement when a known resistance is connected between a positive terminal and a negative terminal of the at least one electric battery cell. An internal resistance of the at least one electric battery cell may be determined in dependence on: a measurement of the open circuit voltage of the at least one electric battery cell (i.e. when the known resistance is not connected between the positive terminal and the negative terminal); a resistance measuring voltage measurement when the known resistance is connected; and the known resistance. Alternatively or in addition, the maturation process may comprise connecting a load, such as a FET, between a positive terminal and a negative terminal of the at least one electric battery cell. The internal resistance of the at least one electric battery cell may be determined in dependence on measurement of current drawn and voltage across the terminals when the load is connected. The maturation process may further comprise comparing the internal resistance with a predetermined resistance value with the step of determining the integrity of the at least one electric battery cell being in dependence on the comparison. A determination of compromised integrity may be made if the internal resistance is greater than the predetermined resistance value. Unduly high internal resistance may be caused by electrolyte underfill or leakage, poor electrode welds or improper SEI formation.

Plural such internal resistances may be determined at spaced apart times based on measurements taken at respective times. The maturation process may comprise comparing a difference between two internal resistances with a predetermined internal resistance difference value, with the step of determining the integrity of the at least one electric battery cell being in dependence on the comparison. A determination of compromised integrity may be made if the difference between the two internal resistances is greater than the predetermined internal resistance difference value. More specifically, a determination of compromised integrity may be made if a rate of change of internal resistance is greater than a predetermined rate of change of internal resistance. An unduly high rate of change of internal resistance may be caused by electrolyte leakage.

The maturation process may further comprise measuring a temperature of the at least one electric battery cell. The step of determining the integrity of the at least one electric battery cell may be in dependence on at least one temperature measurement. More specifically, a measured temperature may be compared with a predetermined temperature. A determination of compromised integrity may be made if the measured temperature is greater than the predetermined temperature. Alternatively or in addition, a first temperature measurement and a second temperature measurement may be taken at spaced apart times, a temperature difference between the first and second temperature measurements may be determined, and the temperature difference compared with a threshold temperature difference. If the temperature difference is greater than the threshold temperature difference the at least one electric battery cell may be determined to be of compromised integrity. Unduly high temperature may be caused by an internal short.

The maturation process may further comprise determining a second derivative with time of at least one of open circuit voltage, internal resistance and temperature. A determination of compromised integrity may be made in dependence on analysis of the second derivative. More specifically, a determination of compromised integrity may be made if the second derivative is outside a predetermined limit. Furthermore, a determination of compromised integrity may be made if the second derivative is at least one of: less than a first predetermined second derivative; and greater than a second predetermined second derivative.

The step of determining the integrity of the at least one electric battery cell may be performed in the measurement apparatus. An outcome from the step of determining the integrity of the at least one electric battery cell may be conveyed to a remote location and more specifically to central computing apparatus at the remote location. The outcome may comprise identification of the at least one electric battery cell as being of compromised integrity. Alternatively or in addition, the step of determining the integrity of the at least one electric battery cell may be performed at a location remote from the measurement apparatus and more specifically in central computing apparatus at the remote location. An outcome from the step of determining the integrity of the at least one electric battery cell may comprise identification of the at least one electric battery cell as being of compromised integrity.

In practice, the maturation process may be performed at the same time on each of plural electric battery cell units. There may therefore be communication from each of the plural electric battery cell units to the remote location.

The maturation process may further comprise providing a cell removal signal in dependence on the step of determining the integrity of the at least one electric battery cell and more specifically when the at least one electric battery cell has been determined to be of compromised integrity. The cell removal signal may be provided by the measurement apparatus or by central computing apparatus at a remote location. Provision of the cell removal signal may comprise providing an operator perceptible output, such as by way of a display comprised in the central computing apparatus. The operator may thus be apprised of the need to remove the at least one electric battery cell from the maturation process.

The maturation process may further comprise conveying an outcome from the step of determining the integrity of the at least one electric battery cell to a remote location and more specifically to central computing apparatus at the remote location. The outcome from the step of determining the integrity of the at least one electric battery cell may be conveyed wirelessly to the remote location. The measurement apparatus may be configured accordingly as described further below. The outcome may comprise identification of the at least one electric battery cell as being of compromised integrity.

The maturation period may be of plural days duration. More specifically, the maturation period may be at least one week, at least two weeks or at least three weeks. During the maturation period and more specifically throughout the duration of the maturation period the at least one electric battery cell may be subject to a temperature above room temperature and more specifically above 25° C., 30° C. or 35° C. The at least one electric battery cell may be stored during the maturation period in a temperature-controlled environment. The maturation period may comprise at least a part of a shipment period. The at least one electric battery cell may not be subject to a temperature-controlled environment during the shipment part of the maturation period. Alternatively, and where circumstances allow, the at least one electric battery cell may be subject to a temperature-controlled environment during the shipment part of the maturation period.

The maturation process may be performed on plural electric battery cells, the plural electric battery cells being constituted as a group of electric battery cells. The group of electric battery cells may be electrically connected to provide a desired level of voltage or current and may, after the maturation process, be brought into use in an electric battery and perhaps with other groups of electric battery cells.

The measurement apparatus may comprise voltage measuring apparatus. The voltage measuring apparatus may comprise a resistor across the terminals of the at least one electric battery cell, the resistor forming part of a voltage divider arrangement. The measurement apparatus may further comprise an analogue-to-digital converter that is operative to convert an analogue output from the voltage divider arrangement to digital form. The measurement apparatus may further comprise a processor configured to perform processes described herein. The processor may be a microcontroller. Alternatively or in addition, the processor may comprise electronic circuitry further to or instead of a microcontroller, the electronic circuitry being configured to perform processes described herein. The measurement apparatus may therefore comprise circuits having structures and/or non-transitory memory having programmed instructions to perform these processes.

The measurement apparatus may further comprise a temperature sensor which senses temperature of the at least one electric battery cell. An output from the temperature sensor may be converted to digital form as described above.

The measurement apparatus may further comprise a load, such as a FET or a resistor of known value, and a switch operative to connect the load across the positive and negative terminals of the at least one electric battery cell.

The measurement apparatus may further comprise communication apparatus and more specifically wireless communication apparatus. The wireless communication apparatus may be configured to provide for radio frequency communication. The communication apparatus may provide for communication with computing apparatus at a remote location.

The measurement apparatus may be incorporated in the at least one electric battery cell. More specifically, the measurement apparatus may be incorporated in the at least one electric battery cell during a previous stage of a manufacturing process, such as prior to a formation process. The measurement apparatus may be incorporated in structure of the at least one electric battery cell whereby the measurement apparatus is an integral part of the at least one electric battery cell. The measurement apparatus may be used during another part of the manufacturing process, such as during the formation charging process, or during service.

The at least one electric battery cell may comprise a lithium-ion electrochemical arrangement and more specifically a lithium-ion polymer electrochemical arrangement.

The at least one electric battery cell may be comprised in an electric battery whereby the maturation process is performed on the electric battery.

According to a second aspect of the present invention, there is provided a manufacturing process for at least one electric battery cell, the manufacturing process comprising: a formation process performed on the at least one electric battery cell; and a maturation process according to the first aspect of the present invention.

Embodiments of the second aspect of the present invention may comprise one or more features of the first aspect of the present invention.

According to a further aspect of the present invention there is provided a maturation process for at least one electric battery cell, the process comprising: charging the at least one electric battery cell; subjecting the at least one electric battery cell to a maturation period of at least one day wherein no electrical load other than a measurement apparatus is connected to the at least one electric battery cell; taking at least one measurement of the open circuit voltage of the at least one electric battery cell with the measurement apparatus; and determining the integrity of the at least one electric battery cell in dependence on the at least one measurement.

Embodiments of the further aspect of the present invention may comprise one or more features of the first aspect of the present invention.

BRIEF DESCRIPTION OF DRAWINGS

Further features and advantages of the present invention will become apparent from the following specific description, which is given by way of example only and with reference to the accompanying drawings, in which.

DESCRIPTION OF EMBODIMENTS

Figure 1:
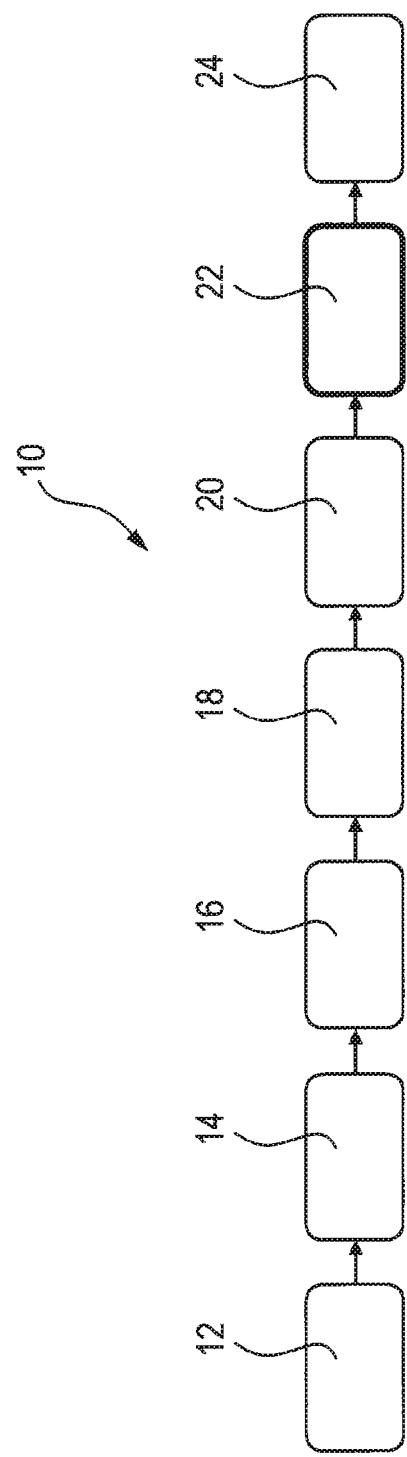
FIG. 1 is a block diagram representation of an electric battery manufacturing process comprising a maturation process according to an embodiment of the invention.

A block diagram representation of an electric battery manufacturing process comprising a maturation process according to an embodiment of the invention is shown in FIG. 1. The electric battery manufacturing process 10 starts with manufacture of the electrodes 12, followed by stacking 14 and then assembly 16. The assembled structure is then filled with electrolyte and sealed 18. Thereafter, the electric battery is subject to a formation charging process 20. The formation charging process 20 constitutes the first charging cycle for the newly manufactured electric battery and involves subjecting the electric battery to carefully controlled charge and discharge cycles to prepare the electric battery for service. When the formation charging process is complete, the electric battery is subject to a maturation process 22. The maturation process 22 is described in detail below. When the maturation process 22 is complete, the electric battery is packaged and shipped for subsequent use 24. Although the present description with reference to FIGS. 1 to 3 makes reference to electric batteries, the present description is equally applicable to an electric battery cell or a connected group of electric battery cells.

Figure 2:
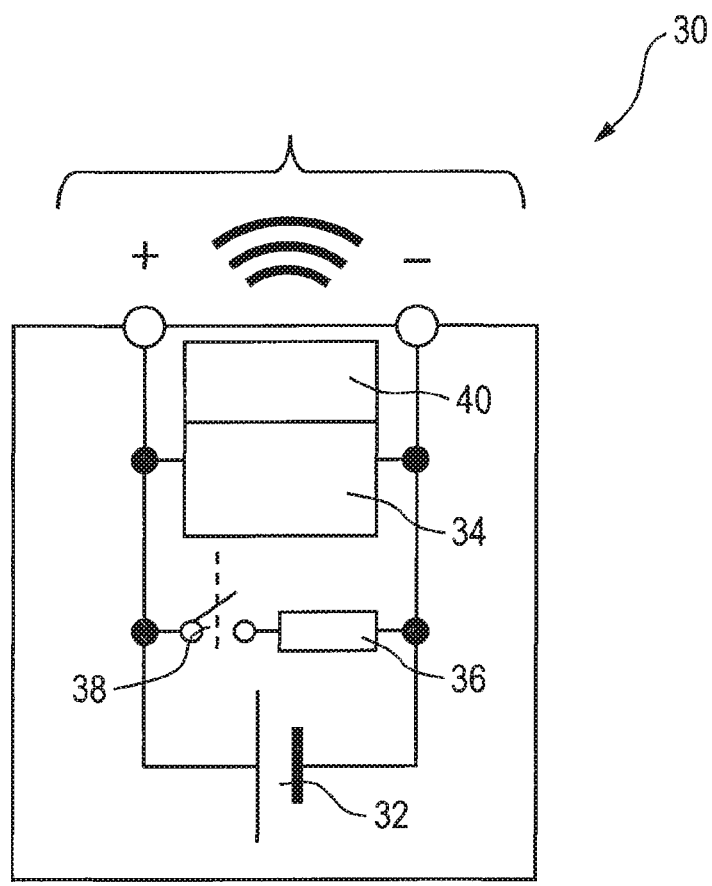
FIG. 2 is a representation of an electric battery and measurement apparatus used during the maturation process.

A representation of an electric battery and measurement apparatus 30 used during the maturation process 22 is shown in FIG. 2. The measurement apparatus 30 is connected across the positive and negative terminals of an electric battery 32. The measurement apparatus 30 is incorporated in the electric battery 32 at an earlier stage of the manufacturing process 10, such as during assembly 16 whereby the measurement apparatus is operative during the formation charging process 20, the maturation process 20 and during use of the electric battery following packaging and shipping 24. The measurement apparatus 30 comprises measurement circuitry 34. The measurement circuitry 34 comprises voltage measuring apparatus, a temperature sensor, an analogue-to-digital converter that is operative to convert an analogue output from each of the voltage divider arrangement and the temperature sensor to digital form, and a processor which receives digital signals from the analogue-to-digital converter and processes the received digital signals. The voltage measuring apparatus comprises a first resistor of known value which is connected across the terminals of the electric battery with the resistor forming part of a voltage divider arrangement. The temperature sensor is disposed in the electric battery to sense the temperature of the electric battery.

The measurement apparatus 30 further comprises a second resistor 36 of known value and an electrically actuated switch 38 operative to connect the second resistor across the positive and negative terminals of the electric battery in parallel with the first resistor of the voltage divider arrangement. The second resistor 36 is connected to and disconnected from the positive and negative terminals by way of the switch 38 with the switch being controlled by the processor. Connection and disconnection of the second resistor 36 provides for measurement of the internal resistance of the electric battery. A first voltage is measured by way of the measurement circuitry 34 when the second resistor 36 is disconnected and a second voltage is measured by way of the measurement circuitry when the second resistor is connected. The processor is operative to determine the difference between the first and second voltages with the internal resistance being determined thereon in view of the resistances of the first and second resistors being known. In an alternative approach, a FET is used instead of the second resistor with current drawn and voltage across the terminals measured when the FET is connected. Design of a current measurement circuit is within the ordinary design capabilities of the person skilled in the art. The internal resistance is determined in dependence on the measured current and measured voltage.

The measurement apparatus 30 further comprises a radio frequency communication transceiver 40 which provides for communication of data to and from the measurement apparatus. In a first form, data communicated from the measurement apparatus comprises battery status data. The battery status data comprises a cell removal signal which is generated by the processor if the electric battery cell is determined during the maturation process to be of compromised integrity. An electric battery is determined to be of compromised integrity in dependence on the electric battery integrity determinations described below, which are performed in the processor. In a second form and where battery integrity determination is performed elsewhere, data communicated from the measurement apparatus comprises periodic voltage, temperature and internal resistance measurements.

Figure 3:
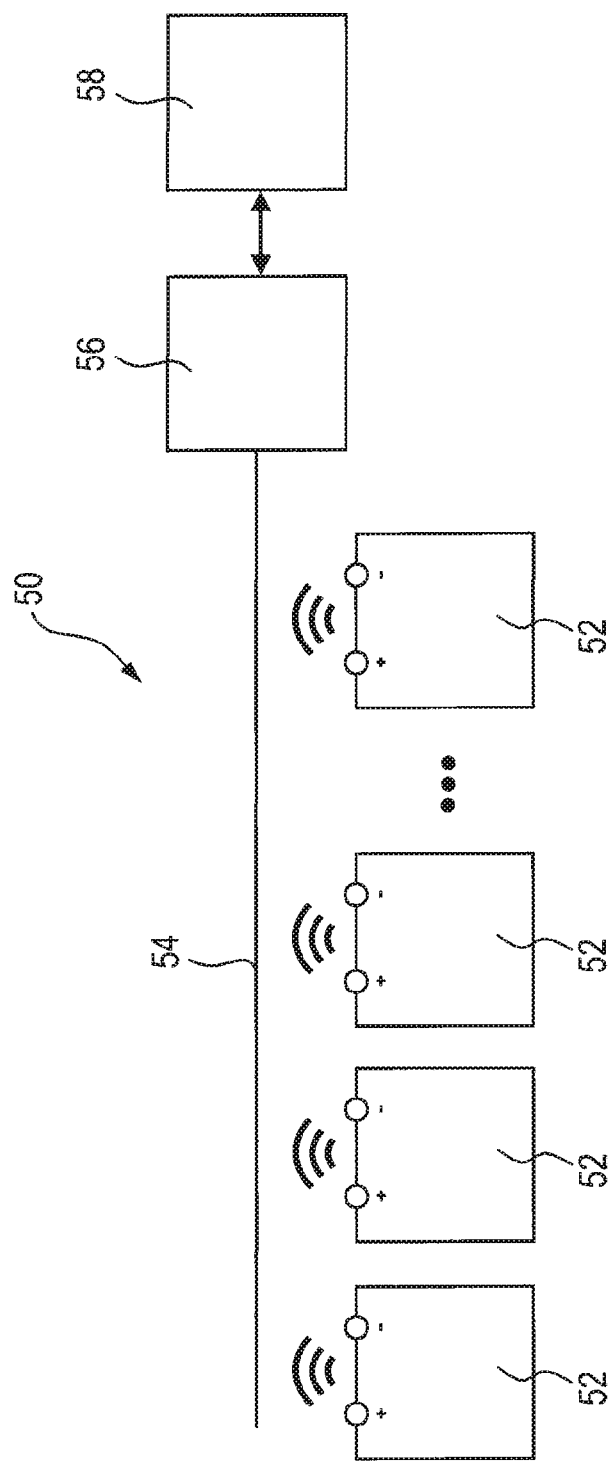
FIG. 3 is a representation of a maturation arrangement comprising plural electric batteries.

A representation of a maturation arrangement 50 is shown in FIG. 3. The maturation arrangement 50 comprises plural electric batteries 52 stored in a temperature-controlled environment during the maturation process. The temperature-controlled environment maintains a temperature of 40° C. during the maturation process. The maturation process has a duration of between several days and a month depending on the type of electric batteries 52 being subject to maturation. Each of the electric batteries 52 is as described above with reference to FIG. 2. Furthermore, the positive and negative terminals of each of the electric batteries 52 are electrically unconnected to external apparatus whereby the measurement apparatus 30 applies the only electrical load to the electric battery. A radio frequency antenna 54 of strip form is disposed such that it extends adjacent the radio frequency communication transceiver 40 of each of the plural electric batteries 52. The radio frequency antenna 54 is electrically coupled to a communications interface module 56 installed within the temperature-controlled environment. The plural electric batteries 52 are therefore electrically isolated from one another.

The communications interface module 56 is in data communication with remote computing apparatus 58. The remote computing apparatus 58 is operative to provide for supervisory control of the measurement apparatus 30 comprised in each of the plural electric batteries 52. The remote computing apparatus 58 is operative to receive data from the measurement apparatus 30 comprised in each of the plural electric batteries 52. According to the first form described above, the remote computing apparatus 58 receives battery status data which comprises a cell removal signal if the electric battery is determined to be of compromised integrity. The remote computing apparatus 58 provides an operator perceptible output, such as by way of a display comprised in the central computing apparatus, in dependence on receipt of the cell removal signal. The operator is thus apprised of the need to remove the electric battery in question from the maturation process. According to the second form described above, the remote computing apparatus 58 receives data communicated from the measurement apparatus comprising periodic voltage, temperature and internal resistance measurements. The periodic voltage, temperature and internal resistance measurements are processed in the remote computing apparatus 58 to make the electric battery integrity determinations described below. Upon identification of an electric battery of compromised integrity, the remote computing apparatus 58 is operative to provide an operator perceptible output whereby the operator is apprised of the need to remove the electric battery in question from the maturation process.

Figure 4:
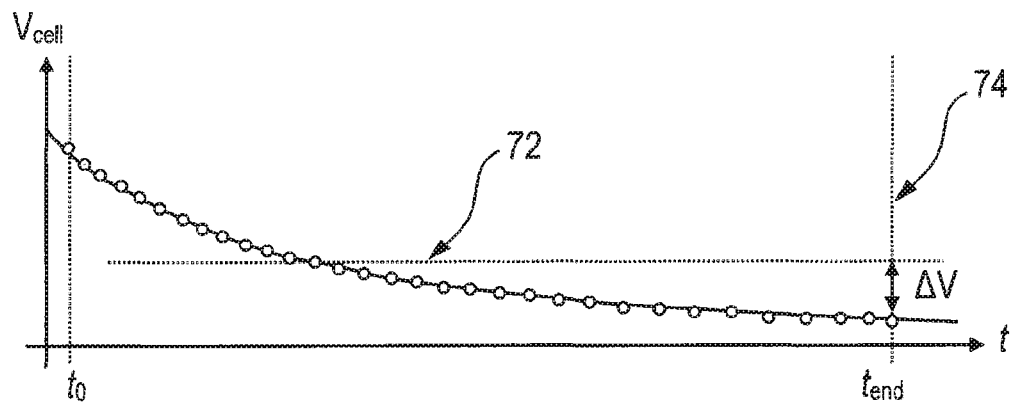
FIG. 4 is a first plot of open circuit voltage over time for an electric battery.

The electric battery integrity determinations made during the maturation process 20 will now be described with reference to FIGS. 4 to 6. A first plot of open circuit voltage over time for an electric battery is shown in FIG. 4. The open circuit voltage of an electric battery is measured at regular intervals, as indicated by the circles in FIG. 4, with the measurement apparatus 30 starting at $t_0$ and ending at $t_{end}$. Electric batteries undergo a relaxation period immediately following charging whereby open circuit voltage measurements taken following charging are liable to provide misleadingly high measurements leading to false determinations of compromised integrity. Measurement of open circuit voltage at regular intervals provides for determination of the trajectory over time of the open circuit voltage. The early part of the trajectory is analysed to determine the end of the relaxation period. The end of the relaxation period is indicated in FIG. 4 by the horizontal dotted line 72. Determination of the end of the relaxation period is described below with reference to FIG. 5. The self-discharge rate is then determined based on open circuit voltage measurements taken after the end of the relaxation period whereby the like of a drop in open circuit voltage $\Delta V$ is determined between the end of the relaxation period and $t_{end}$ which is indicated by the vertical dotted line 74. Further to this, the trajectory of the open circuit voltage after the end of the relaxation period is compared with predetermined trajectories to identify an abnormal trajectory which may be indicative of internal resistance increase, improper SEI formation, electrolyte underfill or leakage, and internal short circuit. Trajectory comparison may provide for identification of electric batteries of compromised integrity before the end of the maturation period.

Figure 5:
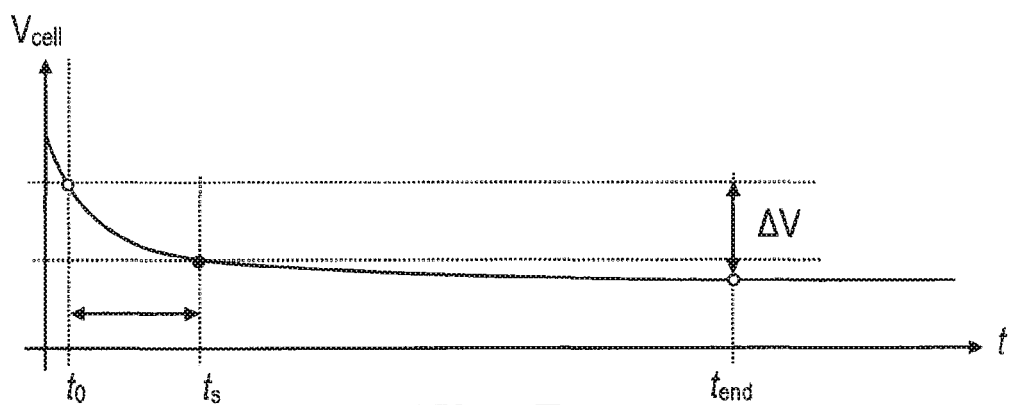
FIG. 5 is a second plot of open circuit voltage over time for an electric battery.

A second plot of open circuit voltage over time for an electric battery is shown in FIG. 5. FIG. 5 serves to illustrate the relaxation period. The time between to and is constitutes the latter part of the relaxation period. As can be appreciated from FIG. 5, the open circuit voltage drop $\Delta V$ between $t_0$ and $t_{end}$ is significantly higher than the open circuit voltage drop between $t_s$ and $t_{end}$ whereby $\Delta V$ is misleadingly high. As described above, the end of the relaxation period is determined as a basis for determining a more properly reflective open circuit voltage drop. The end of the relaxation period is determined by comparing the early part of the open circuit voltage trajectory with a predetermined trajectory that is characteristic of relaxation for the type of battery.

Figure 6:
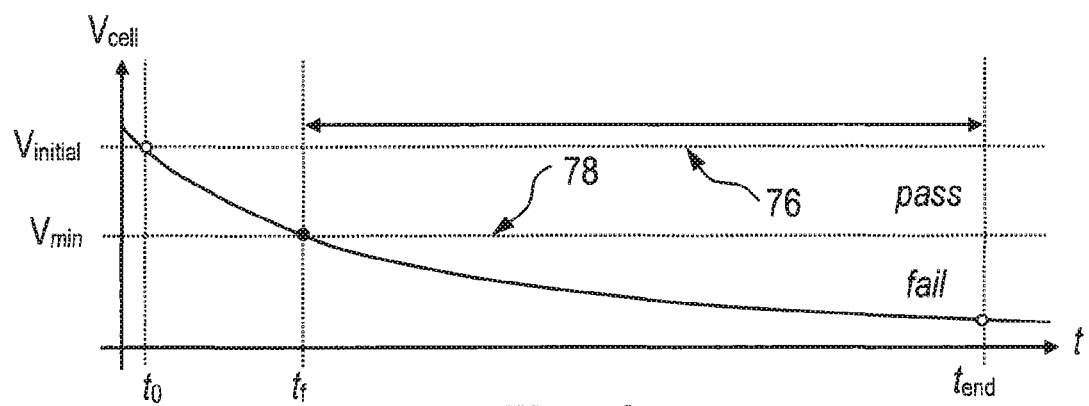
FIG. 6 is a third plot of open circuit voltage over time for an electric battery.

A third plot of open circuit voltage over time for an electric battery is shown in FIG. 6. FIG. 6 serves to illustrate identification of an electric battery of compromised integrity early in the maturation period. Here open circuit voltage measurements are taken from to, as indicated by the higher dotted line 76 in FIG. 6, where the relaxation period has already ended by $t_0$. A predetermined voltage threshold used for determination of unduly high discharge is indicated by the lower dotted line 78 in FIG. 6. As can be seen from FIG. 6, plural measurements of open circuit voltage during the maturation period provide for detection of when the open circuit voltage crosses the predetermined voltage threshold at a time $t_f$ which is about 20% of the way through the maturation period. In contrast, a known maturation process would determine unduly high discharge after the end of the maturation period.

Five different scenarios involving compromised integrity will now be described. For the five scenarios, two typical cells, cell A and cell B, have the following characteristics at 25° C.:

| Property | Cell A | Cell B |
| --- | --- | --- |
| Capacity 'C' | 50 Ah | 40 Ah |
| Technology | LFP | NMC |
| Vnom | 3.2 V | 3.7 V |
| VMax | 3.65 V | 4.2 V |
| Vmin | 2.5 V | 2.7 V |
| Rint (internal resistance) | 1 mOhm @ 50% SOC | 1.5 mOhm at 50% SOC |

First Scenario

The internal self-discharge is too high whereby the open circuit voltage drops by more than a predetermined voltage after a period of time. Here, the open circuit voltage of a battery cell is measured at spaced apart times and the change in voltage compared with a threshold voltage difference:

| Example Cell | Example $\Delta V$ Threshold | Action if $\Delta V$ less than or equal to limit | Action $\Delta V$ more than limit |
| --- | --- | --- | --- |
| Cell A | −100 mV | Cell ok | Reject cell as defective |
| Cell B | −100 mV | Cell ok | Reject cell as defective |

Second Scenario

The internal self-discharge is too high whereby the gradient of the change in open circuit voltage over time is too high. By tracking the trajectory, a determination is made when the battery cell is in the relaxation period, in steady state or self-discharging. At 30% SOC after the cell has relaxed, the following discharge rate limits are expected:

| Example Cell | Example Discharge Rate Limit | Action if discharge less than limit | Action if discharge greater than or equal to limit |
| --- | --- | --- | --- |
| Cell A | C/40000 (1.25 mA) | Cell ok | Reject cell as defective |
| Cell B | C/40000 (1 mA) | Cell ok | Reject cell as defective |

Figure 7:
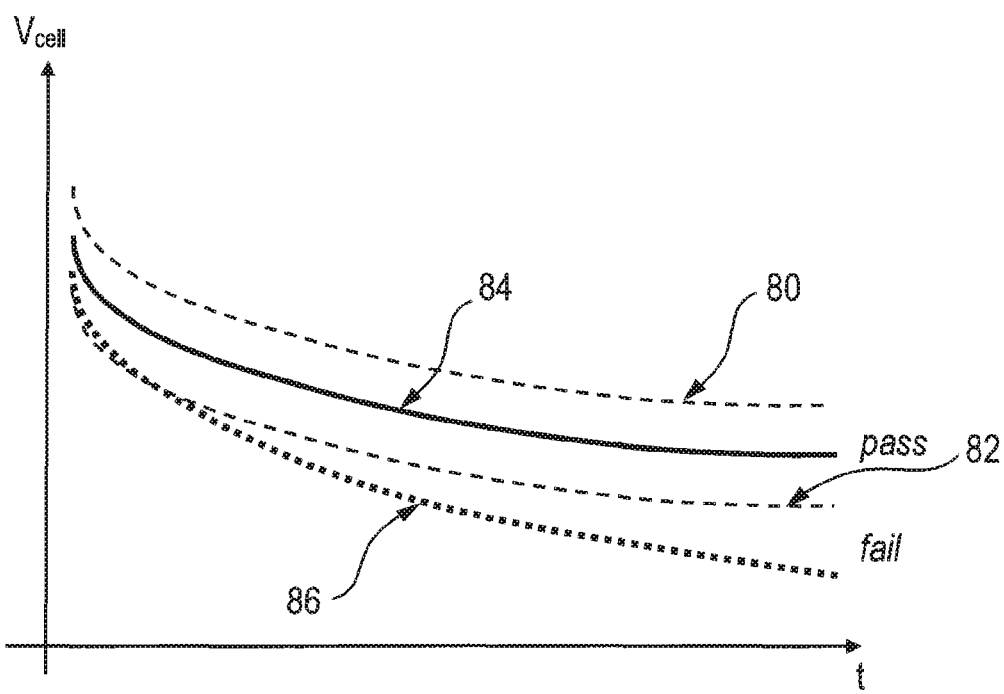
FIG. 7 shows a plot of discharge rate which is characteristic of a non-compromised electric battery and a plot of discharge rate which is characteristic of a compromised electric battery.
Figure 8:
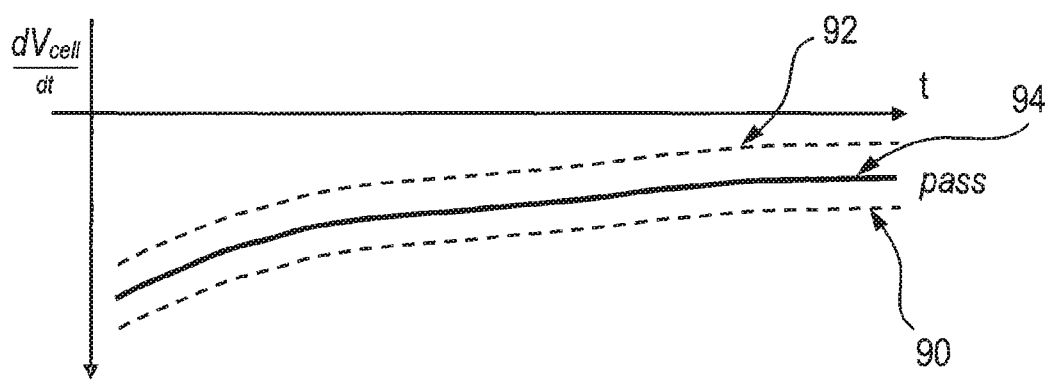
FIG. 8 shows a plot of rate of change of discharge rate which is characteristic of a non-compromised electric battery.

Discharge is not measured directly. Instead, the open circuit voltage is used as an indicator of discharge. The discharge rate is related to the open circuit voltage by the plots shown in FIG. 7. The open circuit voltage over time is compared with predetermined upper limit 80 and lower limit 82 curves to determine if the open circuit voltage falls between the upper and lower limit curves. A first plot 84 in FIG. 7 falls between the upper and lower limit curves 80, 82 and is therefore determined not to be of compromised integrity. A second plot 86 in FIG. 7 falls below the lower limit curve 82 and is therefore determined to be of compromised integrity. The upper and lower limit curves 80, 82 are characteristic for a particular battery type. Further to this, the second derivative with time of open circuit voltage is analysed to reveal further information, such as a change between a positive rate of change and a negative rate of change that is indicative of a compromised battery cell. Use of the second derivative is illustrated in FIG. 8. The second derivative of open circuit voltage is compared with predetermined upper rate limit 90 and lower rate limit 92 curves to determine if the second derivative falls between the upper and lower rate limit curves. As can be seen from FIG. 8, an example plot 94 falls between the upper rate limit 90 and the lower rate limit 92 curves whereby no compromised integrity is determined in this respect.

Third Scenario

The internal resistance is too high whereby the internal resistance is above a predetermined threshold. As mentioned above, this could be caused by electrolyte underfill/leakage, poor electrolyte welds or improper SEI formation. For a second resistor of 1 Ohm, the open circuit voltage is measured when the second resistor is disconnected, and the open circuit voltage is measured again when the second resistor is connected as described above. Under certain circumstances and where the measurement current is of sufficient significance, other integrity tests described herein are adapted to take account of the measurement current.

| Example Cell | OCV | V Resistor On | Internal R | Example Limit | Results |
|---|---|---|---|---|---|
| Cell A | 3 | 2.997 | 1 mOhm | 1.2 mOhm | Cell Ok |
| Cell B | 3 | 2.997 | 1 mOhm | 1.7 mOhm | Cell Ok |
| Cell A | 3 | 2.990 | 1.6 mOhm | 1.2 mOhm | Reject cell as defective |
| Cell B | 3 | 2.990 | 1.6 mOhm | 1.7 mOhm | Cell Ok |

Fourth Scenario

The gradient of change in internal resistance over time is too high. This could be caused by electrolyte leakage. Plural internal resistance measurements are taken over time.

| Example Cell | Example Limit | Action if internal resistance above limit | Action if internal resistance less than or equal to limit |
|---|---|---|---|
| Cell A | 0.1 mOhm/24 hrs | Reject cell as defective | Cell Ok |
| Cell B | 0.1 mOhm/24 hrs | Reject cell as defective | Cell Ok |

Fifth Scenario

The battery cell has an internal short whereby the change in temperature of the battery cells is greater than a threshold value. The temperature is measured as described above at spaced apart times and compared with the threshold value.

| Example Cell | Example ΔTemp Limit | Action if temperature greater than ΔTemp limit | Action if temperature is less than or equal to the limit |
|---|---|---|---|
| Cell A | 10deg C. | Reject cell as defective | Cell Ok |
| Cell B | 10deg C. | Reject cell as defective | Cell Ok |

The invention claimed is:

1. A maturation process for an electric battery cell, the process comprising:
   charging the electric battery cell;
   subjecting the electric battery cell to a maturation period of at least one day wherein no electrical load other than a measurement apparatus is connected to the electric battery cell;
   taking at least one measurement of an open circuit voltage of the electric battery cell during the maturation period using the measurement apparatus, wherein the measurement apparatus is incorporated into a structure of the electric battery cell, forming an integral part of the electric battery cell; and
   determining whether the electric battery cell is defective in dependence on the at least one measurement.

2. The maturation process according to claim 1, wherein the at least one measurement is compared with a predetermined voltage value, wherein determining whether the electric battery cell is defective depends on the comparison of the at least one measurement with the predetermined voltage value.

3. The maturation process according to claim 1, comprising taking plural measurements during the maturation period, the plural measurements being taken at spaced apart times.

4. The maturation process according to claim 3, further comprising:
   comparing a voltage difference between a first and a second of the plural measurements of the open circuit voltage with a predetermined difference value, wherein determining whether the electric battery cell is defective depends on the comparison of the voltage difference with the predetermined difference value.

5. The maturation process according to claim 3, further comprising:
   determining a voltage difference between a first and a second of the plural measurements of the open circuit voltage;
   determining a time difference between the first and second measurements; and
   determining a rate of change of voltage in dependence on the voltage difference and the time difference, wherein determining whether the electric battery cell is defective depends on comparison of the rate of change of voltage with a predetermined rate of change.

6. The maturation process according to claim 1, wherein at least three measurements are taken during the maturation period, voltage differences between adjacent pairs of measurements being determined to thereby obtain at least a first voltage difference and a second voltage difference, the maturation process comprising determining at least one discharge phase in dependence on at least the first voltage difference and the second voltage difference, the at least one discharge phase comprising a relaxation period, wherein determining whether the electric battery cell is defective depends on at least one voltage measurement taken after the relaxation period.

7. The maturation process according to claim 1, wherein plural measurements of the open circuit voltage of the electric battery cell are taken at spaced apart times to provide a trajectory of open circuit voltage measurements over time, the maturation process comprising comparing the trajectory with a predetermined trajectory to determine an end of the relaxation period, wherein determining whether the electric battery cell is defective depends on at least one open circuit voltage measurement taken after the end of the relaxation period.

8. The maturation process according to claim 1, comprising taking at least one resistance measuring voltage measurement when a load is connected between a positive terminal and a negative terminal of the electric battery cell, an internal resistance of the electric battery cell being determined in dependence on: the at least one resistance measuring voltage measurement and one of a measured current drawn by the load or a resistance of the load.

9. The maturation process according to claim 8, further comprising:
comparing the internal resistance with a predetermined resistance value, wherein determining whether the electric battery cell is defective depends on the comparison of the internal resistance with the predetermined resistance value.

10. The maturation process according to claim 8, further comprising determining plural internal resistances at spaced apart times based on measurements taken at respective times, the maturation process comprising comparing a difference between two internal resistances with a predetermined internal resistance difference value, wherein determining whether the electric battery cell is defective depends on the comparison with the predetermined internal resistance difference value.

11. The maturation process according to claim 8, wherein the electric battery cell is determined to be defective if a rate of change of determined internal resistance is greater than a predetermined rate of change of internal resistance.

12. The maturation process according to claim 1, further comprising at least one of:
measuring a temperature of the electric battery cell and comparing the measured temperature with a predetermined temperature, wherein determining whether the electric battery cell is defective depends on the comparison of the measured temperature with the predetermined temperature; or
measuring a first temperature and a second temperature at spaced apart times, determining a temperature difference between the first and second measured temperatures, and comparing the temperature difference with a threshold temperature difference, wherein determining whether the electric battery cell is defective depends on the comparison of the temperature difference with the threshold temperature difference.

13. The maturation process according to claim 1, further comprising determining a second derivative with time of at least one of: measured open circuit voltages; internal resistances determined for the electric battery cell; and
measured temperatures of the electric battery cell, the step of determining whether the electric battery cell is defective depends on analysis of the second derivative.

14. The maturation process according to claim 13, wherein the electric battery cell is determined to be defective if the second derivative is at least one of: outside a predetermined limit, less than a first predetermined second derivative, or greater than a second predetermined second derivative.

15. The maturation process according to claim 1, wherein determining whether the electric battery cell is defective is performed in the measurement apparatus, the maturation process further comprising: transmitting out an outcome of determining whether the electric battery cell is defective, the outcome comprising identification of the electric battery cell as being defective.

16. The maturation process according to claim 1, further comprising providing a cell removal signal in dependence on determining whether the electric battery cell is defective.

17. The maturation process according to claim 1, wherein: the maturation period is of a plural days duration.

18. The maturation process according to claim 1, wherein the electric battery cell is subject to a temperature above 35° C. during the maturation period.

19. The maturation process according to claim 1, wherein: the maturation period comprises at least a part of a shipment period.

20. The maturation process according to claim 1, wherein the electric battery cell comprises a lithium-ion electrochemical arrangement.

* * * * *